(12) United States Patent
Thacker et al.

(10) Patent No.: US 8,896,112 B2
(45) Date of Patent: Nov. 25, 2014

(54) MULTI-CHIP MODULE WITH SELF-POPULATING POSITIVE FEATURES

(71) Applicant: Oracle International Corporation, Redwood City, CA (US)

(72) Inventors: Hiren D. Thacker, San Diego, CA (US); Ashok V. Krishnamoorthy, San Diego, CA (US); John E. Cunningham, San Diego, CA (US); Chaoqi Zhang, Atlanta, GA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 13/838,602

(22) Filed: Mar. 15, 2013

(65) Prior Publication Data

US 2014/0264854 A1 Sep. 18, 2014

(51) Int. Cl.

| | |
|---|---|
| *H01L 23/02* | (2006.01) |
| *H01L 23/48* | (2006.01) |
| *H01L 23/52* | (2006.01) |
| *H01L 29/40* | (2006.01) |
| *H01L 23/00* | (2006.01) |

(52) U.S. Cl.
CPC ............... *H01L 24/14* (2013.01); *H01L 24/81* (2013.01)
USPC .................. 257/686; 257/777; 257/E23.085; 257/E25.006; 257/E25.013; 257/E25.018; 257/E25.021; 257/E25.027

(58) Field of Classification Search
CPC .......................... H01L 25/0657; H01L 25/0756

USPC ................. 257/686, 777, E23.085, E25.006, 257/E25.013, E25.018, E25.021, E25.027
See application file for complete search history.

(56) References Cited

U.S. PATENT DOCUMENTS

| | | | | |
|---|---|---|---|---|
| 5,006,201 | A * | 4/1991 | Kaukeinen | 216/24 |
| 5,681,634 | A * | 10/1997 | Miyamoto et al. | 428/64.6 |
| 6,114,221 | A * | 9/2000 | Tonti et al. | 438/455 |
| 6,583,554 | B2 * | 6/2003 | Lee | 313/495 |
| 6,974,604 | B2 | 12/2005 | Hunter et al. | |
| 7,086,134 | B2 * | 8/2006 | Dautartas et al. | 29/464 |
| 7,435,011 | B2 * | 10/2008 | Takeuchi et al. | 385/72 |
| 7,440,668 | B2 * | 10/2008 | Colgan et al. | 385/137 |
| 7,550,846 | B2 | 6/2009 | Knights | |
| 7,651,021 | B2 | 1/2010 | Supriya et al. | |
| 7,893,531 | B2 * | 2/2011 | Mitchell et al. | 257/727 |
| 7,899,289 | B2 * | 3/2011 | Shimotsu | 385/52 |
| 8,076,178 | B2 * | 12/2011 | Krishnamoorthy et al. | 438/107 |
| 8,188,581 | B2 * | 5/2012 | Shi et al. | 257/673 |
| 8,218,334 | B2 * | 7/2012 | Chow et al. | 361/790 |
| 8,334,149 | B2 * | 12/2012 | Shi et al. | 438/3 |
| 8,487,429 | B2 * | 7/2013 | Shi et al. | 257/727 |
| 8,564,137 | B2 * | 10/2013 | Zhang | 257/774 |

(Continued)

*Primary Examiner* — Ida M Soward
(74) *Attorney, Agent, or Firm* — Park, Vaughan, Fleming & Dowler LLP; Steven E. Stupp

(57) ABSTRACT

A multi-chip module (MCM) is described. This MCM includes at least two substrates that are mechanically coupled and aligned by positive and negative features on facing surfaces of the substrates. These positive and negative features may mate and self-lock with each other. The positive features may be self-populated into the negative features on at least one of the substrates using a hydrophilic layer in the negative feature. This hydrophilic layer may be used in conjunction with a hydrophobic layer surrounding the negative features on a top surface of at least one of the substrates.

14 Claims, 9 Drawing Sheets

(56) References Cited

U.S. PATENT DOCUMENTS

| | | |
|---|---|---|
| 8,648,463 B2 * | 2/2014 | Thacker et al. ............... 257/737 |
| 8,659,161 B2 * | 2/2014 | Krishnamoorthy et al. .. 257/773 |
| 2002/0196440 A1 * | 12/2002 | Steinberg et al. ............. 356/399 |
| 2003/0062123 A1 | 4/2003 | Hunter et al. |
| 2003/0146518 A1 | 8/2003 | Hikita et al. |
| 2003/0235388 A1 * | 12/2003 | Lee et al. ....................... 385/137 |
| 2005/0150538 A1 * | 7/2005 | Liu et al. ....................... 136/205 |
| 2007/0075442 A1 | 4/2007 | Krishnamoorthy |
| 2007/0138649 A1 | 6/2007 | Knights |
| 2007/0290367 A1 * | 12/2007 | Hwang ......................... 257/778 |
| 2009/0166396 A1 | 7/2009 | Supriya et al. |
| 2011/0074011 A1 | 3/2011 | Shi et al. |
| 2011/0136677 A1 * | 6/2011 | Oldham et al. .................. 506/6 |
| 2011/0170376 A1 * | 7/2011 | Pike et al. ...................... 367/181 |
| 2011/0281395 A1 | 11/2011 | Krishnamoorthy |
| 2012/0139107 A1 | 6/2012 | Nakano |
| 2013/0146905 A1 * | 6/2013 | Ray et al. ........................ 257/88 |

* cited by examiner

MULTI-CHIP MODULE WITH SELF-POPULATING POSITIVE FEATURES

BACKGROUND

1. Field

The present disclosure generally relates to multi-chip modules (MCMs) and techniques for fabricating MCMs. More specifically, the present disclosure relates to an MCM that includes positive features that are self-populated into negative features in a substrate by using hydrophilic and hydrophobic layers.

2. Related Art

Engineers have recently proposed using multi-chip modules (MCMs) to integrate a 3-dimensional (3D) stack of semiconductor chips. A major challenge associated with such MCMs is aligning the chips with respect to each other.

One approach to aligning the chips uses positive features (such as spherical balls) to mechanically couple pairs of negative features (such as pits) on facing surfaces of chips in the MCM. In particular, the positive features may mate with pairs of the negative features, thereby aligning and coupling the chips to each other.

However, it can be expensive and time consuming to position the positive features in the negative features. For example, a pick-and-place assembly technique can be used to put the positive features in the negative features during fabrication of an MCM, but the process is typically slow, which can significantly increase the cost of the MCM.

Hence, what is needed is an MCM and a fabrication technique that does not suffer from the above-described problems.

SUMMARY

One embodiment of the present disclosure provides a multi-chip module (MCM) that includes a first substrate having a first surface. This first substrate includes: first negative features disposed on the first surface, where a given first negative feature is recessed below the first surface and has a first opening, defined by a first edge; and a first layer disposed in the first negative features, where the first layer includes a hydrophilic material. Moreover, the MCM includes: positive features disposed on the first layer in the first negative features, where the positive features protrude above the first surface; and a second substrate having a second surface facing the first surface, where the second substrate includes second negative features disposed on the second surface. Note that a given second negative feature is recessed below the second surface and has a second opening, defined by a second edge. Furthermore, the second negative features are coupled to the positive features so that the first substrate is mechanically coupled to the second substrate.

In some embodiments, the positive features include spherical balls. Moreover, the first negative features and the second negative features may include pits.

Additionally, the first layer may include silicon dioxide.

Furthermore, the first substrate may include a second layer disposed in regions of the first surface surrounding the first negative features, where the second layer includes a hydrophobic material. For example, the second layer may include a silicone. This second layer may have a thickness less than 1 nm.

Moreover, the first substrate may include a semiconductor (such as silicon) and may have a side-wall angle. This side-wall angle may correspond to a symmetry plane of the semiconductor. For example, the first substrate may be hydraulically cleaved from a wafer.

Another embodiment provides a system that includes the MCM.

Another embodiment provides a method for fabricating the MCM. During the method, first negative features are defined on a first surface of a first substrate, where a given first negative feature is recessed below the first surface and has a first opening, defined by a first edge. Then, a first layer is disposed in the first negative features, where the first layer includes a hydrophilic material. Next, a second layer is disposed on the first surface in regions of the first surface surrounding the first negative features, where the second layer includes a hydrophobic material. Moreover, positive features are placed on the first layer in the first negative features, where the positive features protrude above the first surface. Furthermore, second negative features are defined on a second surface of a second substrate, which faces the first surface, where a given second negative feature is recessed below the second surface and has a second opening, defined by a second edge. Additionally, the second negative features are mechanically coupled to the positive features so that the first substrate is mechanically coupled to the second substrate.

In some embodiments, prior to mechanically coupling the second negative features to the positive features, the first substrate is hydraulically cleaved from a wafer. In addition, prior to mechanically coupling the second negative features to the positive features, the second layer may be removed.

BRIEF DESCRIPTION OF THE FIGURES

Note that like reference numerals refer to corresponding parts throughout the drawings. Moreover, multiple instances of the same type of part are designated by a common prefix separated from an instance number by a dash.

DETAILED DESCRIPTION

Embodiments of a multi-chip module (MCM), a system that includes the MCM, and a technique for fabricating the MCM are described. This MCM includes at least two substrates that are mechanically coupled and aligned by positive and negative features on facing surfaces of the substrates. These positive and negative features may mate and self-lock with each other. The positive features may be self-populated into the negative features on at least one of the substrates using a hydrophilic layer in the negative feature. This hydrophilic layer may be used in conjunction with a hydrophobic layer surrounding the negative features on a top surface of at least one of the substrates.

This mechanical-coupling technique may be compatible with high-volume manufacturing. In particular, the positive and negative features may be fabricated on the surfaces using semiconductor-process techniques. Therefore, the cost of the MCM may be significantly reduced.

Figure 1:
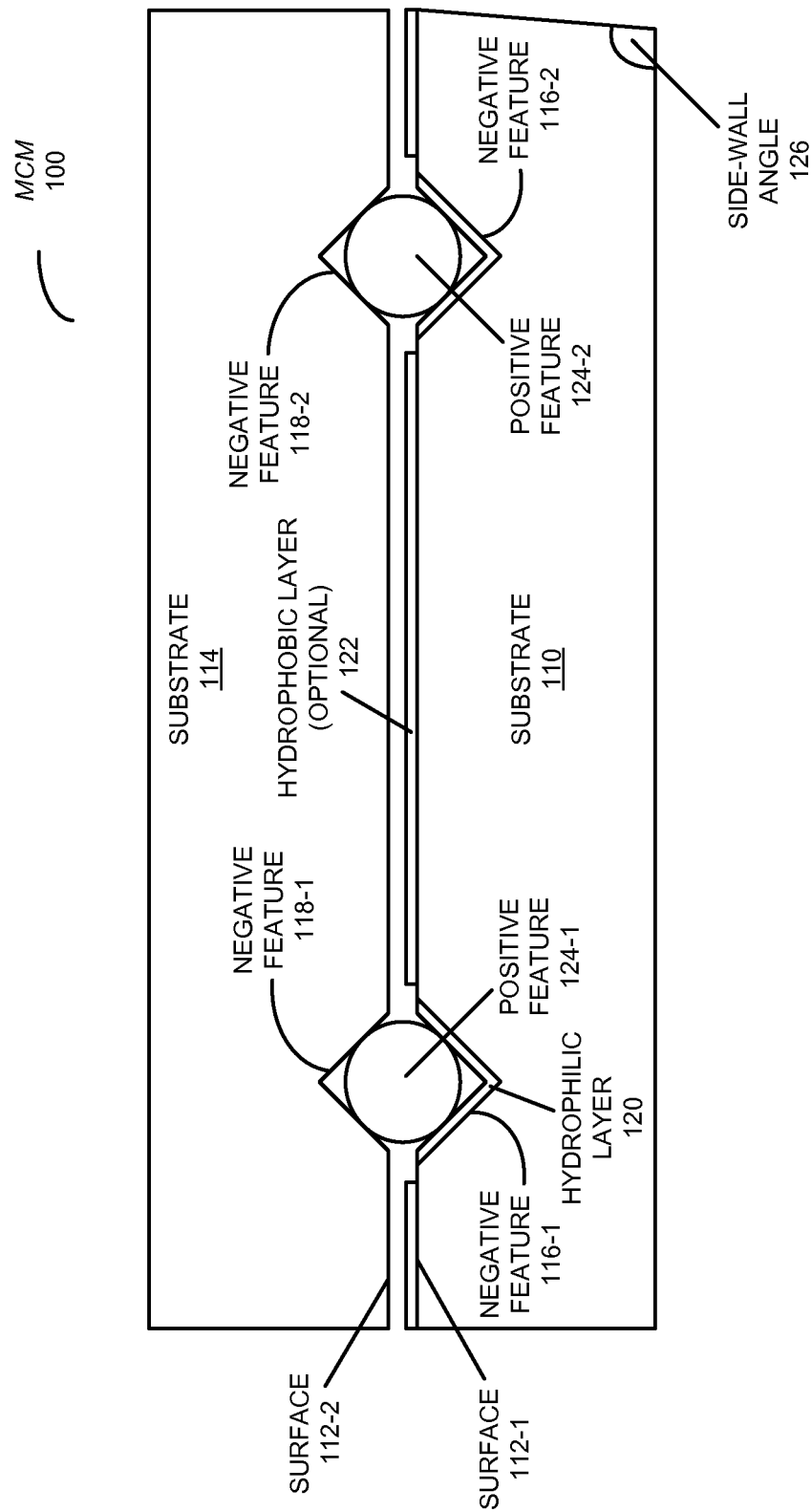
FIG. 1 is a block diagram illustrating a multi-chip module (MCM) in accordance with an embodiment of the present disclosure.

We now describe embodiments of an MCM. FIG. 1 presents a block diagram illustrating an MCM 100. This MCM includes: a substrate 110 having a surface 112-1, and a substrate 114 having a surface 112-2 that faces surface 112-1. For example, substrates 110 and 114 may both be chips, or may be other components.

Substrate 110 may include negative features 116 disposed on surface 112-1, where a given negative feature (such as negative feature 116-1) is recessed below surface 112-1 and has an opening, defined by an edge. Similarly, substrate 114 may include negative features 118 disposed on surface 112-2, where a given negative feature (such as negative feature 118-1) is recessed below surface 112-2 and has an opening, defined by an edge. As illustrated in FIG. 1, negative features 116 and 118 may include pits.

Moreover, negative features 116 may include a hydrophilic layer 120, while there may be an optional hydrophobic layer 122 surrounding negative features 116 on surface 112-1. As described further below, these layers may allow positive features 124 to be self-populated into negative features 116 during fabrication of MCM 100. Positive features 124 (such as spherical balls) may be partially contained in negative features 116. A remainder of positive features 124 may protrude above surface 112-1 and may mate with corresponding negative features 118. In this way, positive features 124 may mechanically align (with submicron accuracy) and couple substrates 110 and 114.

In an exemplary embodiment, hydrophilic layer 120 has a thickness of 10 nm, and optional hydrophobic layer 122 has a thickness of less than 1 nm (such as a monolayer). Moreover, hydrophilic layer 120 may include silicon dioxide, and optional hydrophobic layer 122 may include a silicone (such as poly di-methyl siloxane or PDMS).

In some embodiments, positive features 124 and negative features 116 and 118 may also electrically couple substrates 110 and 114, including: power, ground, and/or input/output signals. However, in some embodiments electrical coupling is provided by separate features (not shown) than those that provide the mechanical coupling.

Note that the mechanical coupling of substrates 110 and 114 may be remateable. For example, the mechanical coupling of substrates 110 and 114 may be released by pulling substrates 110 and 114 apart, or by dissolving an adhesive that holds substrates 110 and 114 together. This may allow MCM 100 to be reworked during fabrication or subsequent testing. However, in some embodiments the mechanical coupling is not remateable. For example, positive features 124 may, at least in part, be reflowed during fabrication and assembly of MCM 100.

The components in MCM 100 may be compatible with wafer-level batch processing, which may significantly reduce the cost of fabricating and assembling MCM 100.

In an exemplary embodiment, a hydrophobic and hydrophilic pattern may be used to achieve large-scale ball-in-pit self-population to facilitate submicron chip-to-chip alignment in an MCM. Spherical alignment balls, which may have a non-hydrophobic or a hydrophilic surface (such as gold or sapphire), may be dispersed in a CMOS-compatible solution (such as de-ionized water), and the etch pits on the surface of the target wafer/chip may be processed to have a hydrophilic surface condition. Then, the de-ionized water-ball solution may be loaded into a population head. As described further below with reference to FIGS. 3 and 4, as the volume of de-ionized water with dispensed balls traverses the pits, either by a scanning or a dropping-head technique, a ball that overlaps with an unpopulated pit may fall in and may be caught in the hydrophilic pit by surface tension. A hydrophobic area on the scanning head and on the population target chip may be used to confine the de-ionized water-ball solution within the intended pits, and may enhance the guiding ability and efficiency of the population head and prevent the wetting of the whole exposed surface. In addition, these hydrophobic layers may prevent or reduce unnecessary loss or scattering of the balls or microspheres. After population, no unpopulated balls may be left on the hydrophobic surface of the target wafer/chip. As described further below with reference to FIG. 7, the ball-in-pit populated wafer with an ultraviolet sensitive tape attached on the backside may be mounted on and hydraulically cleaved using a silicone (such as PDMS) hydraulic cleaving substrate to achieve dicing-free chip singulation.

Therefore, ball-in-pit self-population can be achieved with the combination of hydrophilic pits and a hydrophobic field area. This surface-tension-assisted ball-in-pit population technique may be used at the wafer or chip-scale, and may provide a low-cost solution for fabricating and assembling the MCM.

Figure 2:
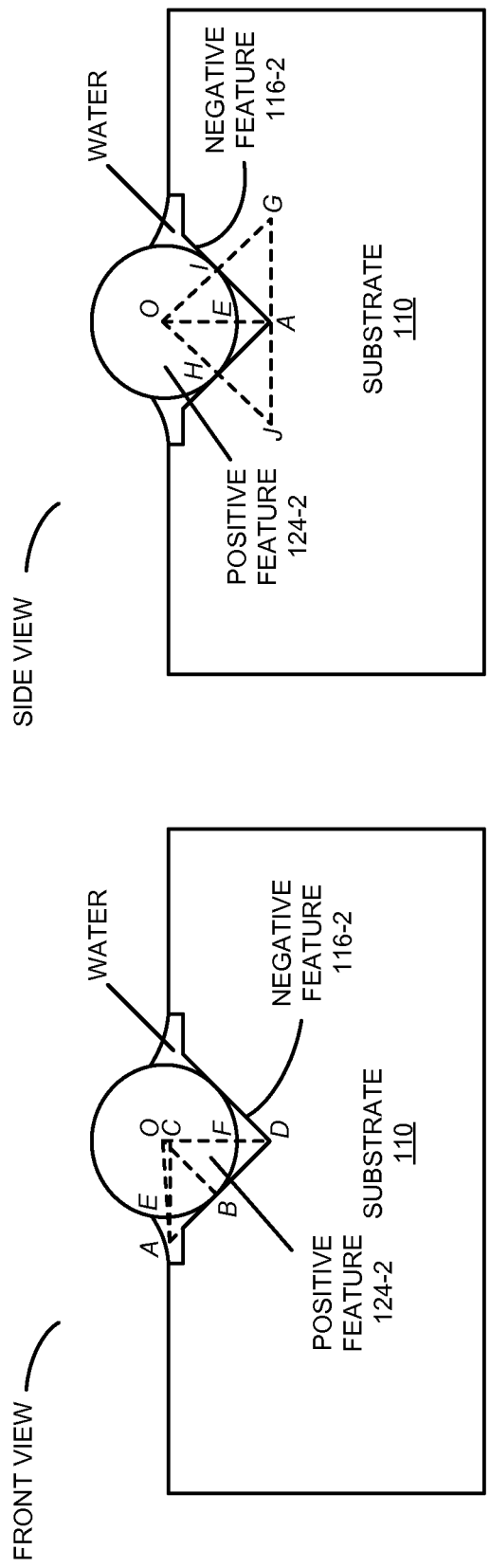
FIG. 2 is a drawing illustrating a surface-tension calculation in accordance with an embodiment of the present disclosure.

The average minimum force to lift a populated ball out of a pit can be estimated to verify that the surface-tension force is large enough to hold a ball in a pit. Specifically, FIG. 2 shows an illustration of a single ball inside a hydrophilic pit, where a tiny volume of water wets the pit sidewalls and the ball and holds it in place during population. To verify if the surface tension is large enough to hold a ball inside a pit, we calculate the average minimum force that would be required to lift the ball out of the pit. In particular, the average minimum force F is estimated from the energy needed for lifting the ball ($E_{lift}$) a distance $L_{CF}$, i.e., $$F = \frac{E_{lift}}{L_{CF}} = \frac{4 \cdot \sigma \cdot S_{HIJG}}{L_{CF}},$$

where σ is the surface tension of the de-ionized water and $S_{HIJG}$ is a surface area over the ball. If F is much larger than the force of gravity, G, acting on the ball, then surface tension is large enough to hold the ball inside the pit. Note that the contact angle of the ball material is assumed as 90°. If the diameter of the ball is 188 μm and the pit opening is 216 μm, the calculated minimum lift force is 183 times larger than the force of gravity on the ball. Because the surface tension is large enough to hold the ball inside the pit, the populated balls cannot fall out even if the chip is flipped over. This calculation is based on the post-population scenario, i.e. the ball is already seated in the pit. During population, the balls are dispersed in the solution, which is completely different than the post-population scenario, and there is no surface tension to pull them out. As noted previously, the ball-in-pit population may be achieved by: scanning a population of balls immersed in de-ionized water across the target pits; or using a so-called 'dropping head.' In both techniques, non-hydrophobic balls dispersed in de-ionized water may be guided or moved above the pits they will populate.

Figure 3:
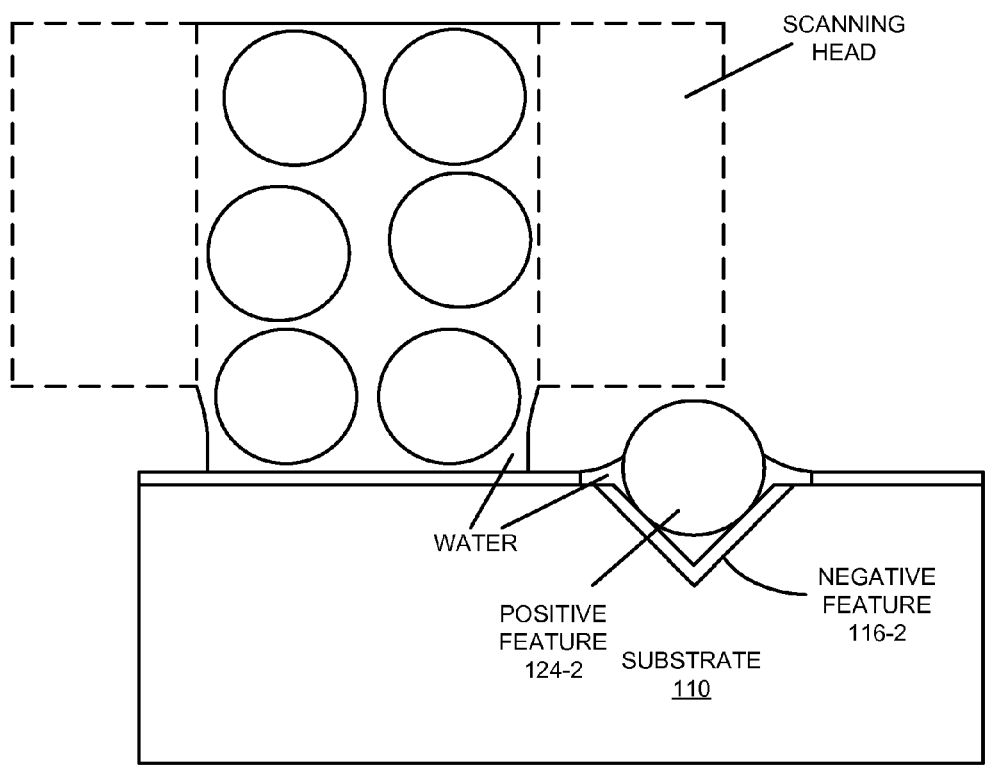
FIG. 3 is a drawing illustrating populating balls in pits in accordance with an embodiment of the present disclosure.

As shown in FIG. 3, for the scanning technique the balls in the de-ionized water may be guided by the scanning head and may move across the surface of the pit or target wafer. As this scanning head moves over a pit or an array of pits, a ball which crosses over any part of an unpopulated pit may be caught or captured by the hydrophilic pit due to the surface-tension force from the water inside the pit. Moreover, a ball standing on the hydrophobic field area may move away with the water column that is being guided, thus leaving behind a clear field area.

Figure 4:
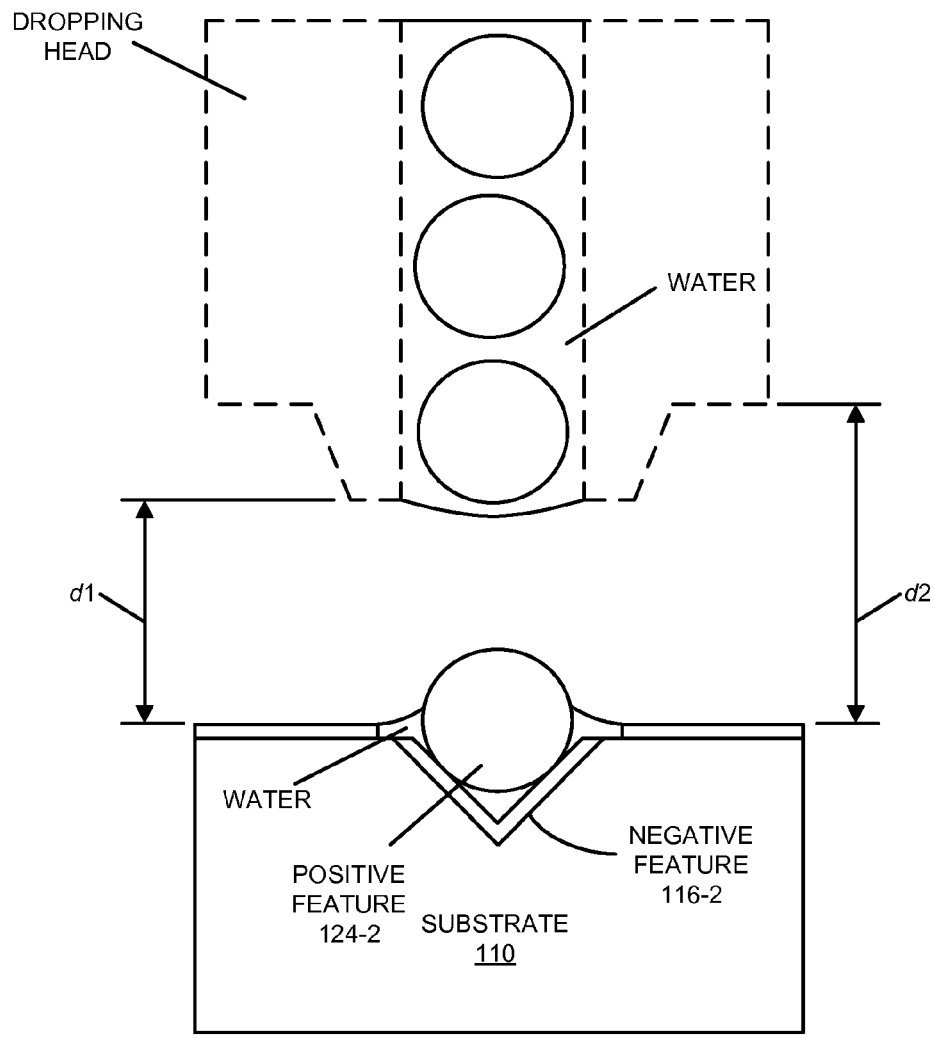
FIG. 4 is a drawing illustrating populating balls in pits in accordance with an embodiment of the present disclosure.

As shown in FIG. 4, for the dropping technique a dropping head containing balls and the de-ionized water may be aligned with the pit array and then moved downward to contact and drop balls into the hydrophilic pits. Alternatively, the dropping head may first be moved down to contact the hydrophobic field area of the pit wafer, and then may be laterally scanned across a short distance to find and drop the balls into their corresponding pits. This short scanning-assisted dropping technique may reduce the alignment accuracy needed between the dropping head and the target pits on the wafer. After dropping the balls into their target pits, the dropping head may be moved away from the pits (for example, by at least a few tens or hundreds of microns) so that balls that did not fill pits come into contact with the hydrophobic field area surrounding the pits. After this short lateral movement, the dropping head may then be lifted away from the wafer/chip surface to disconnect the water column from the pit wafer. Once again, this may reduce the risk of ball scattering or unintended ball loss on the target surface. Therefore, a ball that is not inside a pit may be held by the surface tension of the water column and carried away from the chip.

In addition to using a pattern hydrophobic layer on the target wafer, note that there may be a hydrophobic area on the population head (such as the scanning head of FIG. 3 or the dropping head of FIG. 4) on the surface facing the target wafer to improve performance. Besides this hydrophobic surface, the capillary force, which is inversely proportional to the gap between population head and target wafer, may also be used to confine the de-ionized water around the opening on the population head. By increasing the gap, the capillary force may be reduced, which may allow the water to localize around the population head. However, this configuration may result in multiple layers of balls being guided under the population head. These layers of balls may interfere with each other and may lower the yield. Therefore, a population head with a positive bottom opening may also be used. In particular, the center gap d1 may be smaller than the relatively larger surround gap d2 that is used to prevent over-wetting, and thus over-stacking of the balls when the pits are populated. For example, d2 may be approximately 500 μm for a 200 μm diameter ball. Furthermore, the population head may be adjusted so that it is parallel to the surface of the target wafer. This may ensure that the water-guided balls are populated under a uniform capillary force.

Figure 5:
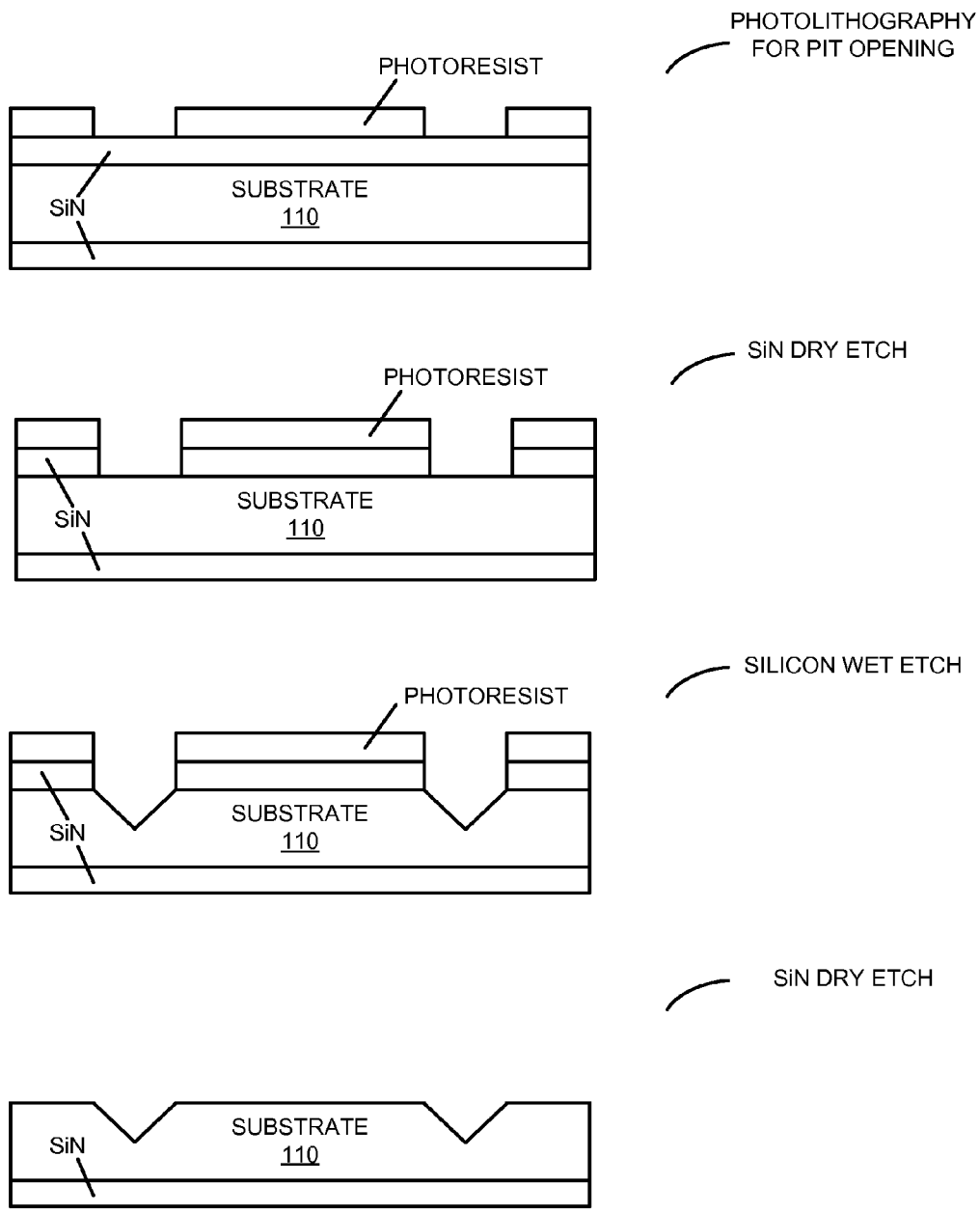
FIG. 5 is a drawing illustrating fabrication of a substrate in accordance with an embodiment of the present disclosure.
Figure 6:
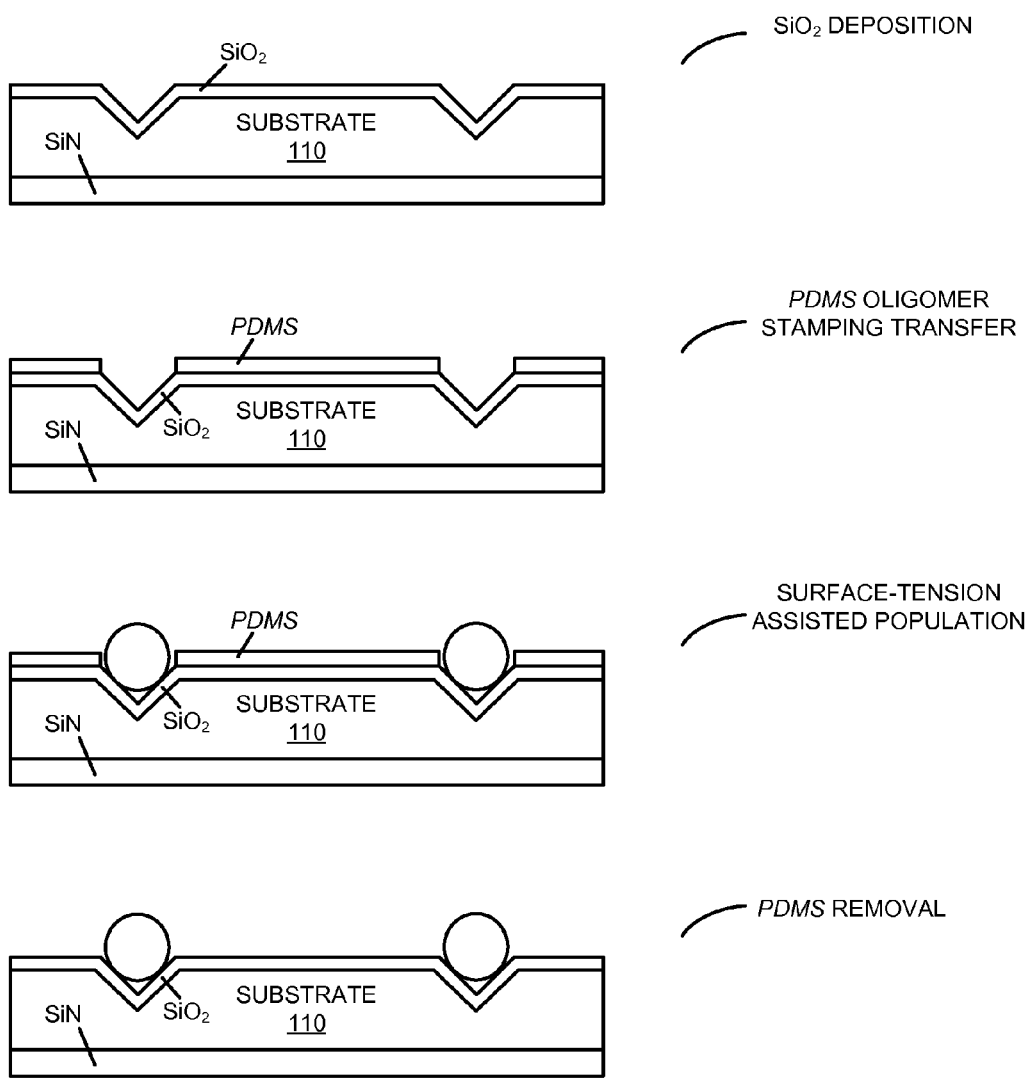
FIG. 6 is a drawing illustrating the fabrication of the substrate in FIG. 5 in accordance with an embodiment of the present disclosure.
Figure 7:
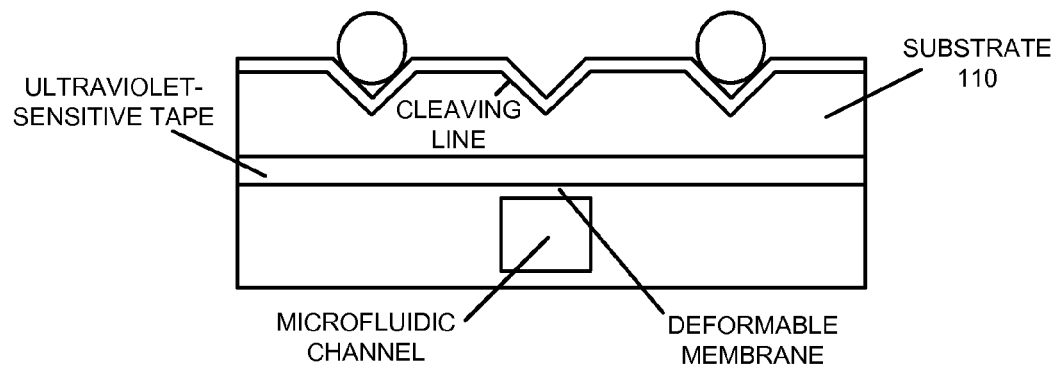
FIG. 7 is a drawing illustrating hydraulic cleaving of a substrate in accordance with an embodiment of the present disclosure.

The hydrophobic surface modification may be fabricated via a stamping process and may be optionally removed by a short dry-etching process. The combination of lithographic processes along with a stamping process may allow the fabricated structures to be suitable for batch-fabrication and, thus, for low-cost manufacturing. As shown in FIGS. 5 and 6, which present drawings illustrating fabrication of a substrate, the fabrication process may include: fabricating the pit wafer with a hydrophobic/hydrophilic pattern; and populating the pits with balls. Subsequently, as shown in FIG. 7, the wafer may be hydraulically cleaved using an elastomeric substrate with microfluidic channels.

In FIGS. 5 and 6, a negative photoresist may be spun onto a silicon wafer with a double-sided silicon-nitride coating, and may be patterned using photolithography to yield a photoresist opening. Then, a nitride dry etch may be used to create a wet-etch hard-mask. The pit array and the cleaving lines may be generated by photoresist stripping and a tetramethylammonium hydroxide (TMAH) silicon wet etch. Next, the silicon-nitride hard-mask for the wet etch may be removed, and the hydrophilic layer (such as silicon dioxide) may be formed on the surface of the wafer, and especially inside the pits, by either silicon-dioxide plasma-enhanced chemical vapor deposition or thermal oxidation. Moreover, a hydrophobic PDMS oligomer layer may be transferred on to the surface of the wafer field area by a stamping process (and, thus, may be disposed on the surface without using photolithography). For example, the contact angle between water and the PDMS oligomer layer may be approximately 90°. Because the pits are negative structures, the hydrophilic surface inside of pits may not be affected during the stamping process. At this point, a wafer with the hydrophilic pits and the hydrophobic field area may be ready for the surface-tension-assisted ball population.

Once the ball-population process is finished, the hydrophobic PDMS oligomer layer may optionally be largely or completely removed by a short dry etch. In particular, the PDMS oligomer layer may have a thickness of approximately 5-10 nm before the dry etch, and may have a monolayer thickness or less after the dry etch. Because the dry-etch rate of PDMS is much higher than the etch rate of silicon dioxide and the ball (with a gold or a sapphire surface), the short dry-etch process may not have any side effects on the underlying silicon wafer. After the dry etch, the contact angle between the water and the surface of the silicon wafer may be much smaller than 90° (i.e., the surface may not hydrophobic anymore). Therefore, all the exposed wafer field areas, and especially the bonding pad areas, may be clean for post processing.

After populating the balls at the wafer level, a hydraulic cleaving technique may be used to singulate chips, as opposed to the traditional dicing operation. This is shown in FIG. 7, which presents a drawing illustrating hydraulic cleaving of a substrate. In particular, shallow and long etch pits as cleaving lines may be fabricated on the front side of the wafer along the singulation boundaries between the chips. Then the ball-populated wafer with the cleaving lines may be aligned and mounted on top of an elastomeric substrate that contains embedded microfluidic channels. As the hydraulic pressure inside of the microfluidic channels is increased, a thin deformable membrane between the fluidic channel and the wafer may be bent. This deflection may apply a uniform cleaving force underneath the cleaving line, causing it to cleave and separate the whole wafer into individual chips. An ultraviolet sensitive tape or adhesive attached on the back side of the wafer may be used to release impact or stress during the cleaving, and may keep the chips in their original positions after the hydraulic cleaving. After around 10 minutes of back side ultraviolet exposure on the ultraviolet sensitive tape, the separated chips can be picked off from the tape. In this way, chips can be singulated from the wafer without disrupting the balls or the positive features (i.e., without knocking them out of the negative features)

Referring back to FIG. 1, substrate 110 may have features that indicate it was hydraulically cleaved from the wafer. In particular, substrate 110 may include a semiconductor (such as silicon) and may have a side-wall angle 126. This side-wall angle may correspond to a symmetry plane of the semiconductor (such as 54.7° as opposed to 90°). In addition, a roughness along the surfaces of substrate 110 adjacent to the cleaving lines may be less than that of surfaces after dicing.

The elastomeric substrate with microfluidic channels used in the hydraulic cleaving may be fabricated by bonding together a bottom PDMS piece with an open channel and the top membrane. For example, the bottom piece with the open channel may be fabricated by molding a PDMS piece on top of a silicon substrate with a photoresist channel pattern. The top PDMS membrane may be obtained by spin coating PDMS on another wafer pretreated with soap water, which may make it easier to subsequently peel off the membrane. After an oxygen plasma treatment on both pieces, the bottom PDMS piece with the open channel may be mounted on top of the PDMS membrane. Then, the PDMS substrate with the microfluidic channels may be obtained by peeling off the bonded two pieces from the wafer.

Figure 8:
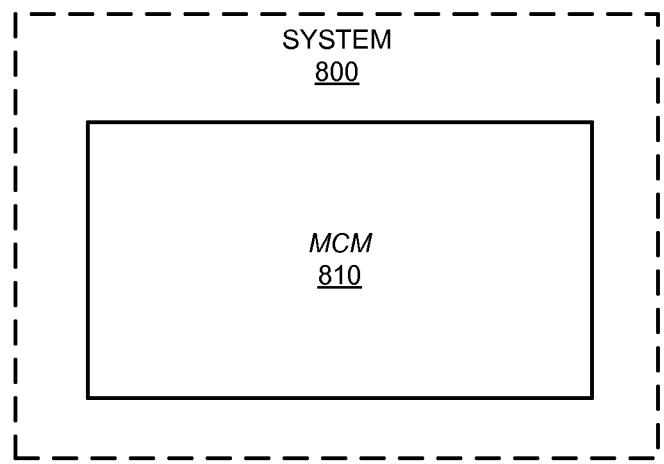
FIG. 8 is a block diagram illustrating a system in accordance with an embodiment of the present disclosure.

One or more of the preceding embodiments of the MCM may be included in a system and/or an electronic device. This is shown in FIG. 8, which presents a block diagram illustrating a system 800 that includes MCM 810. In general, an MCM may include an array of chip modules (CMs) or single-chip modules (SCMs), and a given SCM may include at least one substrate, such as a semiconductor die. Note that an MCM is sometimes referred to as a 'macro-chip.' Furthermore, the substrate may communicate with other substrates, CMs and/or SCMs in the MCM using proximity communication of electromagnetically coupled signals (which is referred to as 'electromagnetic proximity communication'). For example, the proximity communication may include: communication of capacitively coupled signals ('electrical proximity communication') and/or communication of optical signals (such as 'optical proximity communication'). In some embodiments, the electromagnetic proximity communication includes inductively coupled signals and/or conductively coupled signals.

Furthermore, embodiments of the MCM may be used in a variety of applications, including: VLSI circuits, communication systems (such as in wavelength division multiplexing), storage area networks, data centers, networks (such as local area networks), and/or computer systems (such as multiple-core processor computer systems). For example, the MCM may be included in a backplane that is coupled to multiple processor blades, or the MCM may couple different types of components (such as processors, memory, input/output devices, and/or peripheral devices). In some embodiments, the MCM performs the functions of: a switch, a hub, a bridge, and/or a router.

Note that system 800 may include, but is not limited to: a server, a laptop computer, a communication device or system, a personal computer, a tablet, a cellular telephone, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer system may be at one location or may be distributed over multiple, geographically dispersed locations.

MCMs in the preceding embodiments may include fewer components or additional components. For example, negative features 116 in FIG. 1 may be defined in a layer that is deposited on surface 112-1, and these negative features may be recessed below a surface of the top layer deposited on substrate 110. Similarly, positive features 124 in FIG. 1 may protrude above a local surface, which may be surface 112-1 or a surface of a top layer deposited on substrate 110. Thus, in the preceding embodiments a surface of a substrate should be understood to include a surface of a layer deposited on the substrate or a surface of the substrate itself.

Furthermore, although these embodiments are illustrated as having a number of discrete items, these MCMs and systems are intended to be functional descriptions of the various features that may be present rather than structural schematics of the embodiments described herein. Consequently, in these embodiments two or more components may be combined into a single component, and/or a position of one or more components may be changed.

Note that positive features 124 in FIG. 1 and/or negative features 116 and 118 in FIG. 1 may be defined using an additive process (i.e., material deposition) and/or a subtractive process (i.e., material removal). For example, the process may include: sputtering, isotropic etching, anisotropic etching, photolithographic technique and/or a direct-write technique. Additionally, these features may be fabricated using a wide variety of materials, including: a semiconductor, metal, glass, sapphire, and/or silicon dioxide.

Figure 9:
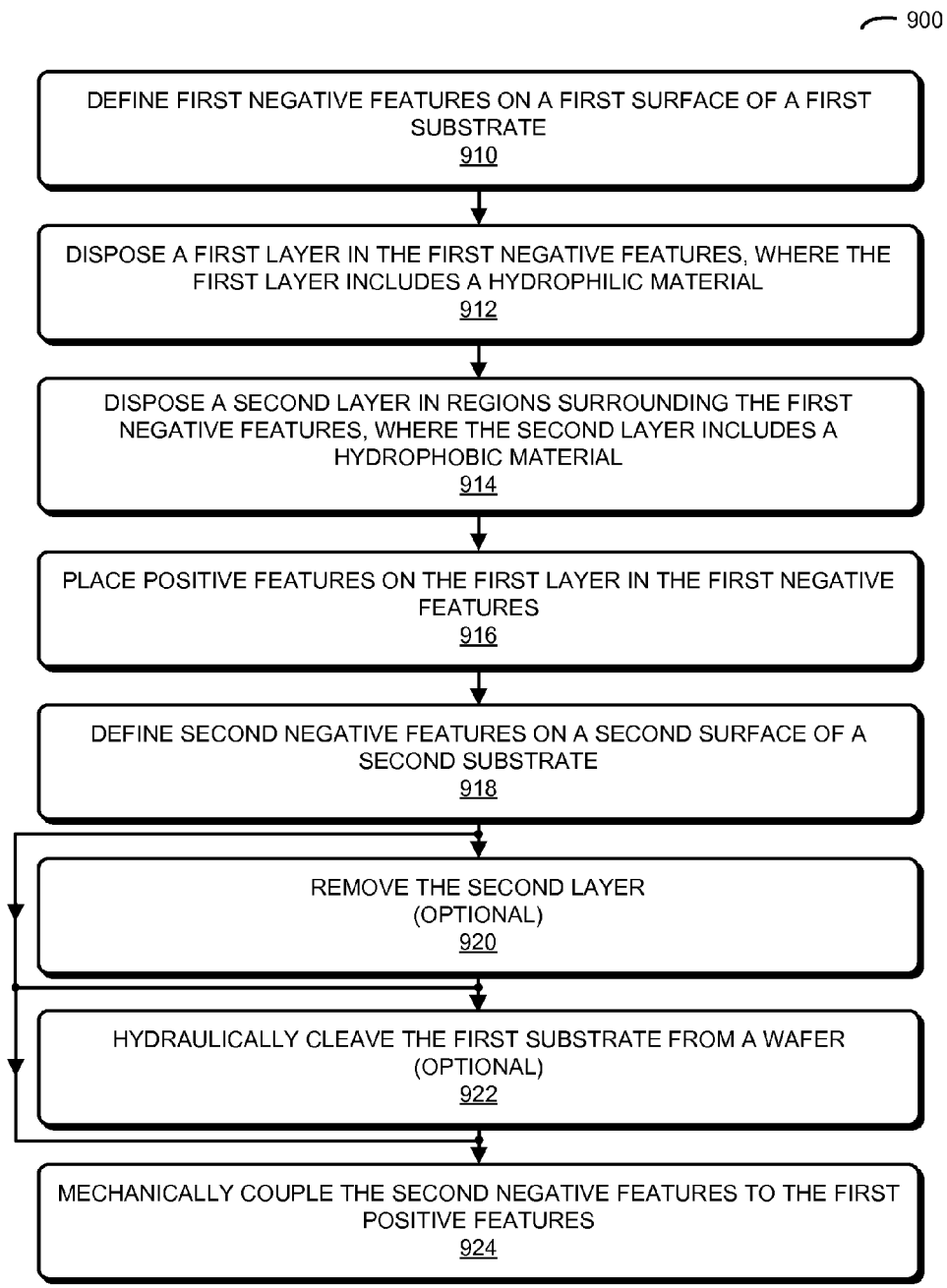
FIG. 9 is a flow chart illustrating a method for fabricating an MCM in accordance with an embodiment of the present disclosure.

We now describe embodiments of a method. FIG. 9 presents a flow chart illustrating a method 900 for fabricating an MCM, such as MCM 100 (FIG. 1). During this method, first negative features are defined on a first surface of a first substrate (operation 910), where a given first negative feature is recessed below the first surface and has a first opening, defined by a first edge. Then, a first layer is disposed in the first negative features, where the first layer includes a hydrophilic material (operation 912). Next, a second layer is disposed on the first surface in regions of the first surface surrounding the first negative features, where the second layer includes a hydrophobic material (operation 914). Moreover, positive features are placed on the first layer in the first negative features (operation 916), where the positive features protrude above the first surface. Furthermore, second negative features are defined on a second surface of a second substrate (operation 918), which faces the first surface, where a given second negative feature is recessed below the second surface and has a second opening, defined by a second edge. Additionally, the second negative features are mechanically coupled to the positive features (operation 924) so that the first substrate is mechanically coupled to the second substrate.

In some embodiments, prior to mechanically coupling the second negative features to the positive features (operation 924), the second layer may optionally be removed (operation 920). In addition, prior to mechanically coupling the second negative features to the positive features (operation 924), the first substrate may be optionally hydraulically cleaved from a wafer (operation 922).

In some embodiments of process 900, there are additional or fewer operations. Moreover, the order of the operations may be changed, and/or two or more operations may be combined into a single operation.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A multi-chip module (MCM), comprising:
a first substrate having a first surface, wherein the first substrate includes:
first negative features disposed on the first surface, wherein a given first negative feature is recessed below the first surface and has a first opening, defined by a first edge; and
a first layer disposed in the first negative features, wherein the first layer includes a hydrophilic material;
positive features disposed on the first layer in the first negative features, wherein the positive features protrude above the first surface; and
a second substrate having a second surface facing the first surface, wherein the second substrate includes second negative features disposed on the second surface, wherein a given second negative feature is recessed below the second surface and has a second opening, defined by a second edge;
wherein the second negative features are coupled to the positive features so that the first substrate is mechanically coupled to the second substrate; and
wherein the first substrate further comprises a second layer disposed in regions of the first surface surrounding the first negative features, wherein the second layer includes a hydrophobic material.

2. The MCM of claim 1, wherein the positive features include spherical balls.

3. The MCM of claim 1, wherein the first negative features and the second negative features include pits.

4. The MCM of claim 1, wherein the second layer has a thickness less than 1 nm.

5. The MCM of claim 1, wherein the second layer includes a silicone.

6. The MCM of claim 1, wherein the first layer includes silicon dioxide.

7. The MCM of claim 1, wherein the first substrate includes a semiconductor and has a side-wall angle; and
wherein the side-wall angle of the first substrate corresponds to a symmetry plane of the semiconductor.

8. A system, comprising:
a processor;
a memory storing a program module configured to be executed by the processor; and
an MCM, wherein the MCM includes:
a first substrate having a first surface, wherein the first substrate includes:
first negative features disposed on the first surface, wherein a given first negative feature is recessed below the first surface and has a first opening, defined by a first edge; and
a first layer disposed in the first negative features, wherein the first layer includes a hydrophilic material;
positive features disposed on the second layer in the first negative features, wherein the positive features protrude above the first surface; and
a second substrate having a second surface facing the first surface, wherein the second substrate includes second negative features disposed on the second surface, wherein a given second negative feature is recessed below the second surface and has a second opening, defined by a second edge; and
wherein the second negative features are coupled to the positive features so that the first substrate is mechanically coupled to the second substrate; and
wherein the first substrate further comprises a second layer disposed in regions of the first surface surrounding the first negative features, wherein the second layer includes a hydrophobic material.

9. The system of claim 8, wherein the positive features include spherical balls.

10. The system of claim 8, wherein the first negative features and the second negative features include pits.

11. The system of claim 8, wherein the second layer has a thickness less than 1 nm.

12. The system of claim 8, wherein the second layer includes a silicone.

13. The system of claim 8, wherein the first layer includes silicon dioxide.

14. The system of claim 8, wherein the first substrate includes a semiconductor and has a side-wall angle; and
wherein the side-wall angle of the first substrate corresponds to a symmetry plane of the semiconductor.

* * * * *

UNITED STATES PATENT AND TRADEMARK OFFICE
CERTIFICATE OF CORRECTION

| | | |
|---|---|---|
| PATENT NO. | : 8,896,112 B2 | Page 1 of 1 |
| APPLICATION NO. | : 13/838602 | |
| DATED | : November 25, 2014 | |
| INVENTOR(S) | : Thacker et al. | |

It is certified that error appears in the above-identified patent and that said Letters Patent is hereby corrected as shown below:

In the Specification

In column 6, line 61, delete "features)" and insert -- features). --, therefor.

Signed and Sealed this
Fourth Day of August, 2015

Michelle K. Lee
*Director of the United States Patent and Trademark Office*